United States Patent [19]

Michel

[11] Patent Number: 4,918,447

[45] Date of Patent: Apr. 17, 1990

[54] INTEGRATED D/A CONVERTER INCLUDING MEANS FOR REDUCING GLITCHES

[75] Inventor: Jean-Pierre Michel, Yerres, France

[73] Assignee: U.S. Philips Corporation, New York, N.Y.

[21] Appl. No.: 860,270

[22] Filed: May 6, 1986

[30] Foreign Application Priority Data

May 14, 1985 [FR] France .............................. 85 07282

[51] Int. Cl.$^4$ ............................................. H03M 1/66
[52] U.S. Cl. .................................................. 341/144
[58] Field of Search ................. 340/347 DA, 347 CC; 307/264, 296; 341/144

[56] References Cited

U.S. PATENT DOCUMENTS 3,290,671 12/1966 Lamoureux .......................... 340/347

OTHER PUBLICATIONS

Millman et al., Pulse, digital and Switching Waveforms, McGraw-Hill Book Co., 9/1965, pp. 396–403.
"Circuit Technique for Ultra Fast D/A Converters", W. Luschnig, R. Petschacher, E. Navratil, Esscirc'83, Ninth European Solid-State Circuits Conference, Sept. 1983.

Primary Examiner—William M. Shoop, Jr.
Attorney, Agent, or Firm—Bernard Franzblau

[57] ABSTRACT

An integrated digital-to-analogue (D/A) converter circuit provided with a device for reducing glitches. The D/A converter converts control signals having n binary states Bn into analogue signals and comprises n differential pairs Pn of transistors T1n and T2n connected to n current generators which supply currents of a value In weighted according to the binary weights $2^n$ of the binary states Bn. The transistors T1n receives their respective binary control signals and the transistors T2n receive the respective binary control signals inverse to the preceding signals. The triggering instant of the differential pairs at a leading edge of the control signal is shifted over the triggering instant at a leading edge of the control signal in that a shift of the triggering thresholds of the transistors T1n with respect to the transistors T2n is effected over a constant value Vd obtained by the device for reducing glitches and constituted by resistors Rn connected in series with the emitters of the transistors of one of the series of transistors T1n or T2n in such a manner that $Rn \cdot In/2 = Vd$.

6 Claims, 5 Drawing Sheets

INTEGRATED D/A CONVERTER INCLUDING MEANS FOR REDUCING GLITCHES

BACKGROUND OF THE INVENTION

This invention relates to an integrated digital-to-analogue (D/A) converter circuit provided with a device for reducing glitches. This type of D/A converter converts control signals having n binary states Bn into analogue signals and comprises n differential pairs Pn of transistors T1n and T2n connected to n current generators which supply currents of a value In weighted according to the binary weights $2^n$ of the binary states Bn.

It further relates to those applications in which such an integrated converter circuit, especially for handling of pictures, is utilized.

A circuit of this type is described in the publication entitled "Circuit Technique for Ultra Fast D/A Converters" by W. Lusching and R. Petschacher, Esscirc '83, ninth European solid state Circuit Conference, Lausanne, Sept. 21-23 (1983).

There is described in this publication a fast digital-to-analogue converter comprising a device for reducing glitches. A digital signal intended to be converted into an analogue signal is generally presented in the form of a word having n binary states. Thus, each binary state Bn will have a binary weight $2^n$. One way of ensuring the digital-to-analogue conversion is consequently to sum up currents, whose values In are weighted according to the binary weight $2^n$ of the binary element Bn controlling them.

In order to ensure a fast digital-to-analogue conversion, the circuit described by these authors comprises differential pairs. However, when the configurations of the successive binary words are very different, before a stable signal is obtained, fast variations of the output associated with the switching of the transistors occur. Thus, with a binary word composed of 8 binary elements, this phenomenon is at its maximum when two successive binary words present the configurations 01111111 and then 10000000, or conversely. For this transition, the seven current sources of the binary states of small weights all have to switch simultaneously to the opposite state of the current source of large weight. In an integrated digital-to-analogue converter circuit, the integration techniques lead to a satisfactory rearrangement of the characteristics of the constituent elements of the integrated circuit, more particularly transistors. The latter consequently have very similar characteristics and will switch under very similar conditions. As a result, during the transistions illustrated by the two preceding configurations, the analogue output signal will present transition anomalies designated as glitches, which are characterized by the magnitude of this glitch and by its duration, and hence by its energy.

The enrgy of the glitches is an important parameter of a digital-to-analogue converter circuit, the more so as the converter circuit is faster, for which therefore the level of the analogue output signal has to be rapidly stabilized.

The solution described by W. Lusching and R. Petschacher consists in that a dissymmetry of operation is produced between the two transistors of each differential pair acted upon by each binary element Bn. In fact, by applying an adjustable polarization signal to the base of one of the transistors of this differential pair, an adjustable delay is obtained, which depends upon the sense of variation of the control signal applied to the base of the other transistor of the differential pair.

However, this has disadvantages because first this external polarization signal necessitates a connection to a pin of the circuit and a circuit suitable for realizing this polarization. Now, it is not always possible to have a pin available in high-performance integrated circuits, in which the pins are reserved for the essential and indispensable functions.

On the other hand, this polarization circuit has to be adapted to the temperature variations of the environment in which the digital-to-analogue converter operates and this must necessitate regulations and suitable means taking into account the chosen external polarization mode.

SUMMARY OF THE INVENTION

The invention therfore has for its object to reduce the energy of the glitches of a digital-to-analogue (D/A) converter circuit by not utilizing regulations and means external of the circuit and by employing means less sensitive to the temperature conditions in which the D/A converter circuit is to operate.

Therefore, the invention as defined in the opening paragraph is characterized in that, the transistors T1n receiving their respective binary control signals and the transistors T2n receiving the respective binary control signals inverse to the preceding signals, the instant of triggering of the differential pairs at a leading edge of the control signal is shifted over the instant of triggering at a trailing edge of the control signal in that a shift of the triggering thresholds of the transistors T1n with respect to the transistors T2n is effected over a constant value Vd obtained by the device for reducing glitches constituted by respective resistors connected in series with the emitters of the transistors of one of the series of trnasistor T1n or T2n in such a manner that $Rn.In/2 = Vd$.

Let is be assumed that a symmetrical differential pair P1 receives a binary signal B1 in the logic state 1 and that the symmetrical differential pair P2 receives a binary signal B2 in the logic state 0. For the pair P1, for example, the transistor T11 is conducting and the transistor T21 is cut off. For the pair P2, the order of the transistors is inverted. The transistor T12 is cut off and the transistor T22 is conducting. When the configuration (B1=1, B2=0) passes to the configuration (B1=0, B2=1) the following transitions occur:

T11 passes to the cut-off state,
T21 passes to the conducting state,
T12 passes to the conducting state,
T22 passes to the cut-off state.

Now, the differential pairs are designed so as to be symmetrical in the geometry of the transistors in order that the parameters characterizing the operation of each of the transistors constituting this pair are very close to each other, their dispersions being associated with the manufacturing method. However, the dynamic behaviour of such a differential pair will not be symmetrical in the sense of these variation of the control signal. In fact, if the variation of the current in the collector of a transistor is observed, it is found that the delay occurring between the control signal and the variation of this current as well as the speed at which this current is developed are not identical according as this transistor passes from a cut-off state to a conducting state, and conversely.

One of the means for reducing this effect consists in shifting the trigger threshold of the different pairs between a transition from a cut-off state to a conducting state and a transition from a conducting state to a cut-off state.

For this purpose, according to the invention, the thresholds of all the transistors T1n or of all the transistors T2n are shifted over a value substantially equal to Vd. Thus, when the logic signal Bn has a transition 1→0 or 0→1, shifts in time will appear for the two transistion types.

Each differential pair is connected to a source of current having a value In which depends upon the binary weight of the binary element to which is connected. There is:

$$In = i.2^2.$$

In order to ensure the shift Vd, the device for reducing glitches is constituted by n resistors Rn, which are each connected in series with respective n emitters of the transistors of one of the series of transistors T1n or T2n. The resistors Rn constitute a series whose values are determined by:

$$Rn \cdot \frac{In}{2} = Vd, \text{ i.e. } Rn = \frac{2 \cdot Vd}{i \cdot 2n}.$$

The value of the elementary current i is determined as a function of the technological possibilities and of the specifications suitable for the relevnt application. The value of the shift Vd depends upon the integration technology used and upon the operating speed provided for the D/A converter. If the value Vd is large, the glitches are reduced, but the time of formation of the output signal increases, which can influence the operating speed of the converter circuit.

This device for reducing glitches remains very effective if the control signal varies with the temperature or with the supply voltage.

BRIEF DESCRIPTION OF THE DRAWINGS

In order that the invention may be readily carried out, it will now be described more fully, by way of example, with reference to the accompanying drawings, in which.

DESCRIPTION OF THE PREFERRED EMBODIMENTS

Figure 1:
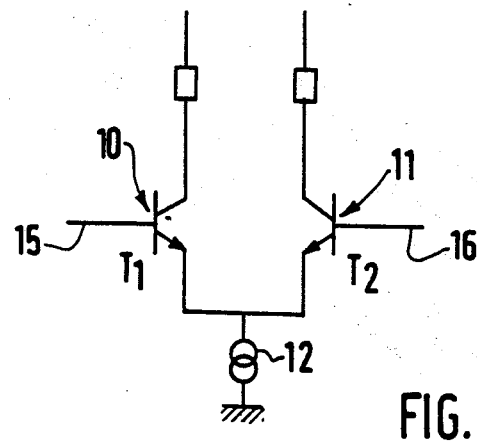
FIG. 1 shows an electric circuit diagram of a conventional differential pair.

FIG. 1 shows the electric circuit diagram of a conventional differntial pair for which the two transistors T1,T2 are connected through their emitters to the same current source 12 and are each connected through their respective collectors via a load resistor to a common potential. The two transistors T1,T2 are controlled at their bases 15,16 by voltages V1 and V2.

Figure 2:
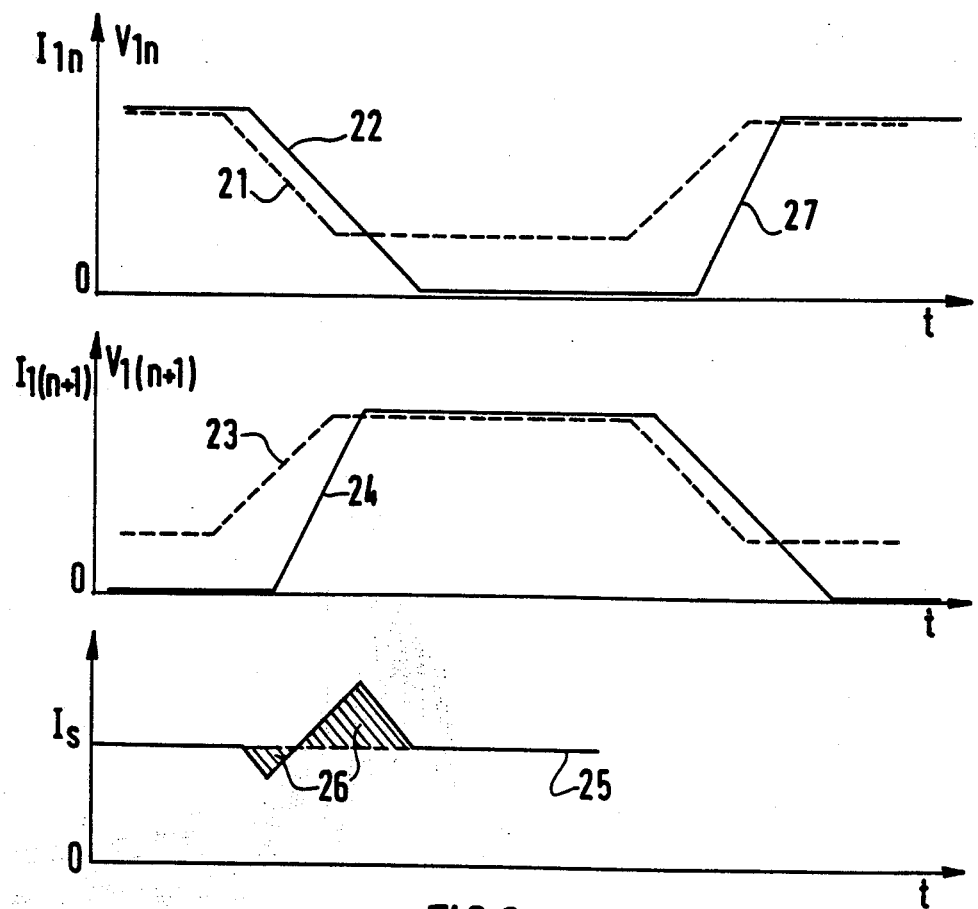
FIG. 2 shows a diagram representing diagrammatically the formation of the control voltages and of the currents as a function of time for two identical differential pairs illustrating the appearance of glitches.

The mechanism for the appearance of glitches is illustrated in FIG. 2. Let it be assumed that there are two differential pairs Pn,Pn+1 such as those of FIG. 1 having identical characteristics. For each pair, the control signals for the bases of T1n and of T2n on the one hand and T1(n+1) and T2(n+1) on the other hand are inverted.

Let it be assumed that at a given instant the control voltage for the base of T1n is V1n and that of the base of T1(n+1) is V1(n+1), as shown by the curves 21 and 23 of FIG. 2. When V1n passes from a high level to a low level, the curren I1n in the collector of T1n shown by the curve 22 is delayed with respect to the control voltage. This delay is due to the different parasitic elements connected to the transistor and to the technology used, for example parasitic capacitances, series resistances . . . . The current I1n decreases to a vlaue zero (transistor T1n cut off). When the control voltage V1n increases again from a low level to a high level, the current I1n is recovered (transistor T1n conducting), but the parasitic elements do not become effective in the same manner and the delay of the current I1n with respect to the control voltage V1n and its time of recovery are different from the preceding case (curve 27).

Let it be assumed that simultaneously the differential pair Pn+1 receives a control signal V1(n+1) inverted with respect to V1n, as shown by the curve 23. The behaviour of the delay mechanisms described for T1(n+1) is identical to that described for T1n. The form of the current I1(n+1) is shown by the curve 24. In order to represent what happens in the digital-to-analogue converter circuit for summing up currents, the sum of the currents I1(n) and I1(n+1) shown by the curve 25 should be considered. The dynamic unsymmetrical behaviour of the differential pairs leads to the appearance of the glitch represented by the cross-hatched zone 26 of FIG. 2.

Figure 3:
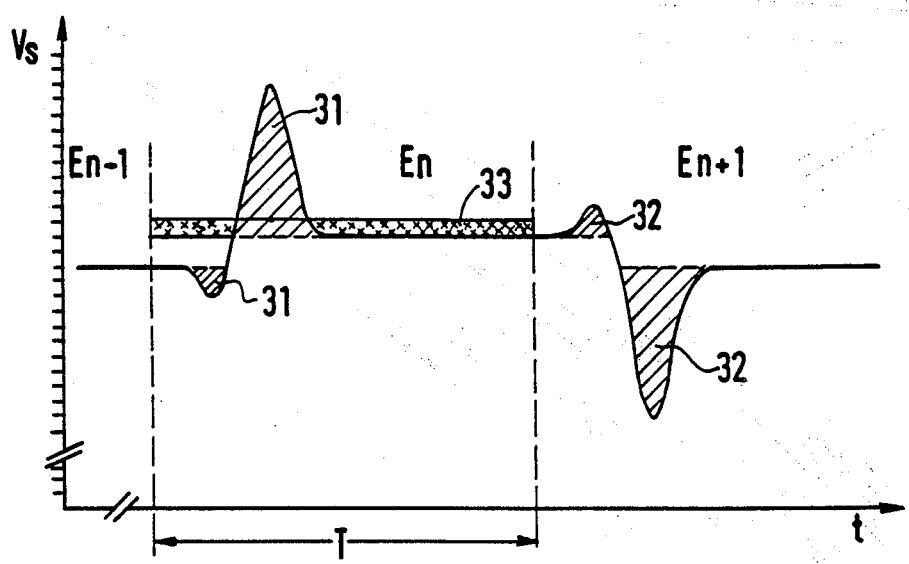
FIG. 3 shows a diagram of the form of the glitches observed in a digital-to-analogue converter circuit.

FIG. 3 shows the real form of the glitches of a digital-to-analogue converter circuit, which ensures that the currents originating from current sources weighted according to a scale of $2^n$ are summed up. The sample $E_{n-1}$ is, for example, the sample 01111111 and the sample En is the sample 10000000. In this example, there are n=8 differential pairs. FIG. 3 shows the output voltage Vs of the digital-to analogue converter as a function of time, in which a sampling period T is isolated. When the sample En is applied, the glitch 31 appears with a certain delay. The zone is indicated by cross-hatched lines. The glitch 31 is characterized by its duration and by the maximum value of its amplitude, that is to say by its energy. The glitch is actually constituted by a negative part and a positive part. The energy of the glitch corresponds to the difference of the energies relative to each of these glitches. The scale of the output voltage Vs of FIG. 3 represents elementary steps equal to the swing of the output signal produced by the change of the single binary least significant element (LSB=least significant bit) of the word to be converted. The energy of the glitch is expressed generally by the product of a duration multiplied by the maximum value of the amplitude expressed in LSB's.

In accordance with the speed, i.e. the duration T, at which the digital-to-analogue converter circuits operates in a given application, this energy will or will not be very critical. This energy characterizing an inaccuracy, i.e. an error, will be the more detrimental as the period T is shorter, i.e. as the D/A converter circuit will operate faster. By adjusting this energy to a mean value spread over the whole period T, the glitch 31 will be brought to the zone 33 indicated by crosses. Its height characterizes the error in the accuracy of the D/A converter relative to this phenomenon and for the sampling period T. The shorter the duration T, the more the height of the zone 33 increases and the more the converter presents an important error that can render it unsuitable for an application requiring a high operating speed. FIG. 3 also shows another glitch 32 generated by a mechanism similar to the preceding mechanism due to the passage from the sample En 10000000 to the sample En+1 01111111.

Figure 4:
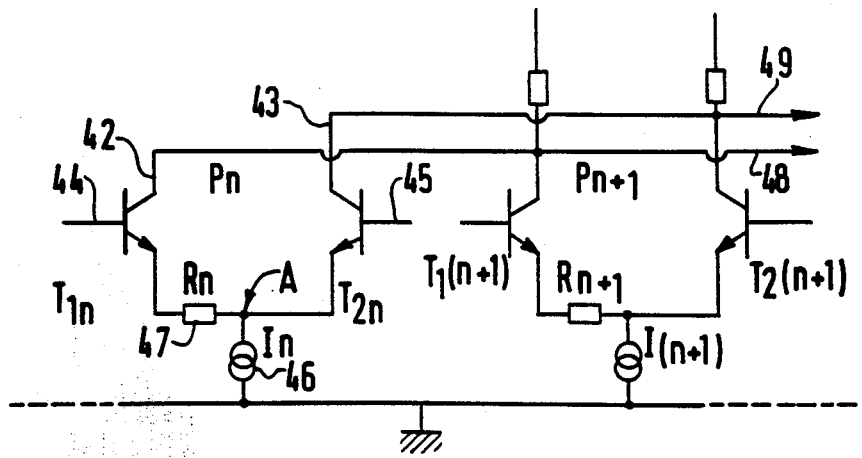
FIG. 4 shows an electric circuit diagram of the two differential pairs provided with the device for reducing glitches according to the invention.

The invention makes it possible to reduce the energy of these glitches by means of a reducing device shown in FIG. 4.

In order to analyse the operating mechanism, the triggering point of a differential pair Pn of transistors T1n and T2n is defined when the currents are equal in the two collectors 42,43, i.e. In/2. In this case, the base-emitter voltage of the silicon transistors T1n and T2n is approximately 750 mV. Control voltages applied to the two bases vary, for example, from a maximum level $V_{max}=2$ V to a minimum level $V_{min}=1.5$ V. In order for the currents I1n and I2n to be equal, it is n ecessary to apply a voltage equal to $V_A+V_{BE}$ to the base 45 of the transistor T2n, while the voltage to be applied to the base 44 of the transistor T1n is equal to $V_A+V_{BE}+R$. In/2, where Rn. In/2 represents the voltage drop Vd in the resistor Rn47 of the differential pair Pn. This voltage Vd is chosen to have a given value as a function of the chosen technology. For example, for a fast bipolar isolation diffusion technology Vd is substantially between 10 mV and 70 mV, for example Vd=30 mV. The currents In being weighted, in the case of the D/A converter circuit described, according to the binary weights $2^n$, the resistors Rn have to be chosen for each differential pair in such a manner that: Rn.In/2=Vd. The output signal of the D/A converter circuit is derived from the outputs 48, 49, which connect all of the collectors of the transistors T1n, T1(n+1) . . . to each other and all of the collectors of the transistors T2n,T2(n+1). . . to each other, respectively.

Figure 5:
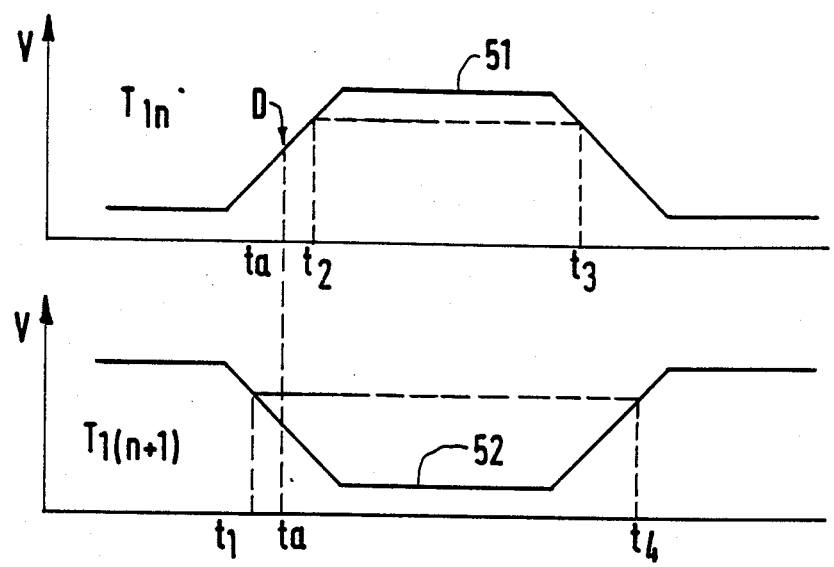
FIG. 5 shows a diagram indicating as a function of time the shift of the triggering instant of two differential pairs Pn and Pn+1 when the transistors T1n and T1(n+1) are controlled, one by a leading edge and the other by a trailing edge.

In order that that currents be equal in the two collectors 42,43, the control voltage to be applied to the base 44 of T1n is a voltage Vd higher than the voltage to be applied to the base 45 of T2n. Consequently, with respect to the situation of a symmetrical differential pair, the transistor T1n will be triggered earlier for a trailing edge of the control voltage, but will be triggered later for a leading edge. This is illustrated by the diagram of FIG. 5, in which the control signals 51,52 of the transistors T1n and T1(n+1) of the differential pairs Pn and P(n+1) are shown as a function of time. These control signals are presented in inverted form in order to handle the most significant situation. The point D, which appears at the instant ta, represents the triggering instant of a symmetrical different differential pair.

However, for differential pairs provided with a device for reducing glitches according to the invention, the triggering instant of the differential pair will be shifted according as the edge is leading or trailing. The level of the control voltage leading to triggering being higher for the transistors provided with their emitter resistances, each transistor will be triggered earlier for a trailing edge and later for a leading edge.

Thus, the following sequence will be observed: T1(n+1) triggers at the instant t1 at a trailing edge; T1n triggers at the instant t2 at a leading edge; T1n triggers at the instant t3 at a trailing edge; T1(n+1) triggers at the instant t4 at a leading edge.

The delay between t1 and t2 associated with the existence of the threshold Vd produced by the resistors Rn, Rn+1 of each pair permits of compensating for the delays which appear in a symmetrical differential pair.

Evidently, each differential pair Pn participates in the energy of the glitches according to the binary weight of the binary element to which it relates. In accordance with the accuracy aimed at, it is possible to neglect the step of correcting the delay for one or several of the pairs of the smallest binary weights.

With a digital-to-analogue converter circuit provided with a device for reducing glitches obtained by means of a fast bipolar isolation diffusion technology operating at words of 8 binary elements, the maximum energy value of the glitches has been of the order of 40 ns.LSB for the binary configuration of the most unfavourable input samples.

This energy, if it is integrated over the duration of the sampling period, as can be realized by the human eye in the case of the applications of handling pictures, will have the same effect as a linearity error of 40 ns.LSB/$\tau$, i.e. in the case of a sampling period of 40 ns an error equivalent of ±1 LSB.

The invention is useful, inter alia, in fast D/A converters in television.

What is claimed is:

1. An integrated digital-to-analogue (D/A) converter circuit provided with a device for reducing glitches, which converts control signals having n binary states Bn into analogue signals and which comprises, n differential pairs Pn of transistors T1n and T2n connected to n current generators which supply currents of a value In weighted according to the binary weights $2^n$ of the binary states Bn, characterized in that, the transistors T1n receive their respective binary control signals and the transistors T2n receive respective binary control signals which are inverse to the control signals for the transistors T1n, the instant of triggering of the differential pairs at the leading edge of the control signal is shifted over the instants of triggering at a trailing edge of the control signal in that the shift of the triggering threshold of the transistors T1n with respect to the transistors T2n is effected over a constant value Vd obtained by the device for reducing glitches and comprising respective resistors connected in series with the emitters of the transistors of one of the series of transistors T1n or T2n in such a manner that Rn.In/2=Vd.

2. An integrated digital-to-analogue (D/A) converter circuit according to claim 1, characterized in that the integrated circuit is made in fast bipolar isolation diffusion technique and the vlaue of Vd is substantially between 10 mV and 70 mV.

3. A D/A converter comprising: a plurality of n differential pairs of transistors $T_{1n}$, $T_{2n}$ where n is the number of bits in a digital signal to be converted to an analog output signal, means for applying the n bits of digital signal to respective control electrodes of respective ones of the transistors $T_{1n}$ and $T_{2n}$ of the differential pairs so that the transistors $t_{1n}$, $T_{2n}$ of each differential pair receive binary control signals that are inverse to one another whereby when $T_{1n}$ is turned on $T_{2n}$ is turned off, and vice versa, a plurality of n current generators which supply binary weighted currents $I_n$, means connecting said current generators to emitters of respective ones of the transistors (either transistors $T_{1n}$ or $T_{2n}$) of respective differential pairs, means connecting collectors of the $T_{1n}$ transistors in common to a first output line and collectors of the $T_{2n}$ transistors in common to a second output line, and means for reducing glitches in the analog output signal comprising a plurality of n resistors $R_n$ connecting emitters of the other ones of said transistors to respective ones of said n current generators, where $V_d = R_n I_n / 2$ thereby to shift the trigger voltage threshold of the transistors $T_{1n}$ with respect to the transistors $T_{2n}$ over a constant voltage value $V_d$.

4. A D/A converter as claimed in claim 3 wherein said n resistors have resistance values $R_n$ distributed across said differential pairs in a binary weighted manner.

5. A D/A converter as claimed in claim 3 wherein $V_d$ is the voltage drop across respective ones of said n resistors.

6. A D/A converter as claimed in claim 3 wherein $V_d$ is in the range of 10 mV to 70 mV.

* * * * *